United States Patent [19]

Sawada

[11] 4,342,960
[45] Aug. 3, 1982

[54] BRUSH ALIGNMENT APPARATUS
[75] Inventor: Fred H. Sawada, Scotia, N.Y.
[73] Assignee: General Electric Company, Schenectady, N.Y.
[21] Appl. No.: 184,358
[22] Filed: Sep. 5, 1980
[51] Int. Cl.³ .................... G01R 31/02; G08B 21/00
[52] U.S. Cl. ........................ 324/158 MG; 340/635; 340/648
[58] Field of Search .............. 324/158 MG; 322/99; 340/635, 659, 662, 679, 648; 318/490; 361/20, 21, 30, 31, 33

[56] References Cited
U.S. PATENT DOCUMENTS
4,204,156 5/1980 Sawada et al. .

Primary Examiner—Ernest F. Karlsen
Attorney, Agent, or Firm—John F. Ahern

[57] ABSTRACT

An apparatus is disclosed for aligning brushes of a dynamoelectric machine such as a dc generator or motor to minimize arcing of the brushes. The alignment monitor processes electrical signals from brushes of a dynamoelectric machine during tests in which various levels of buck or boost current are superimposed on a preselected level of excitation current applied to the machine; the monitor produces output signals which, together with the levels of applied buck or boost currents, are indicative of the brushholder rigging adjustment which is required to achieve the optimum rigging position for a wide range of arc-free machine operation. Included in the brush alignment monitor are, respectively, a high-pass filter, a clipping network, rectification means, a second high-pass filter, a discriminator, an rf amplifier and a peak integrator with alignment indicating means. Also included is an rf generator network which is used to test the operation of the alignment apparatus.

4 Claims, 11 Drawing Figures

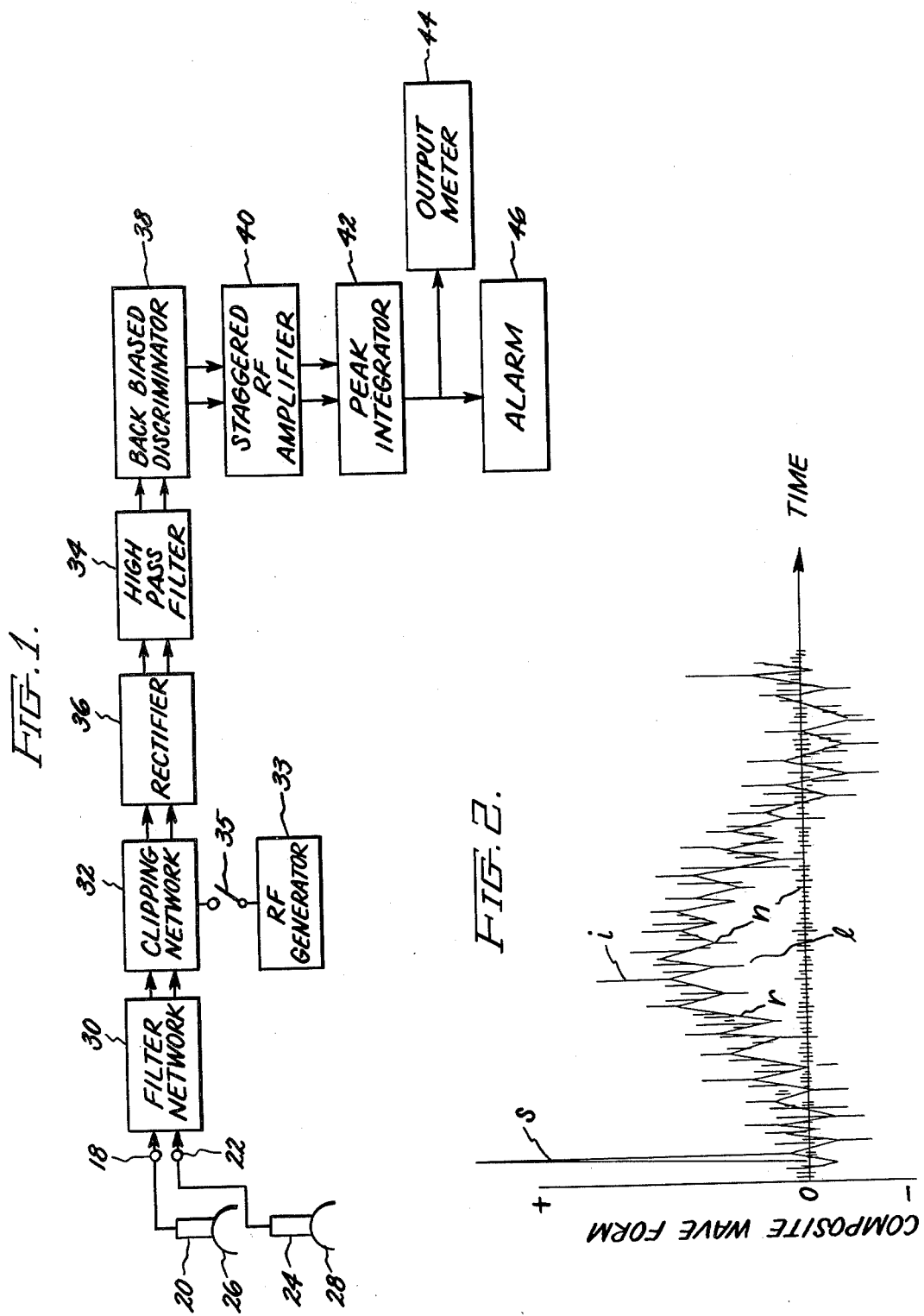

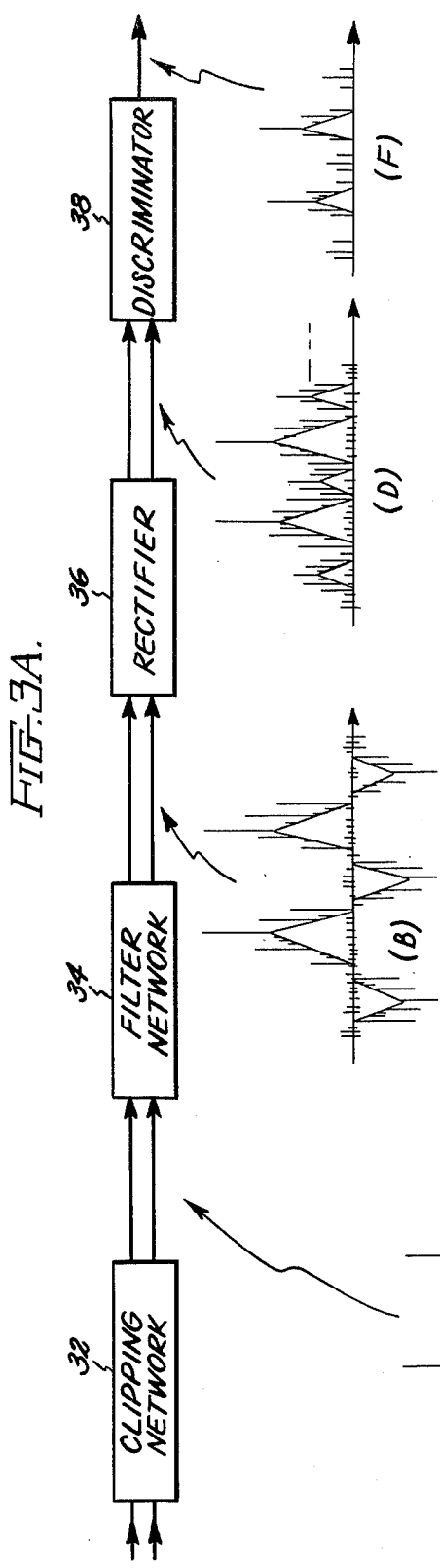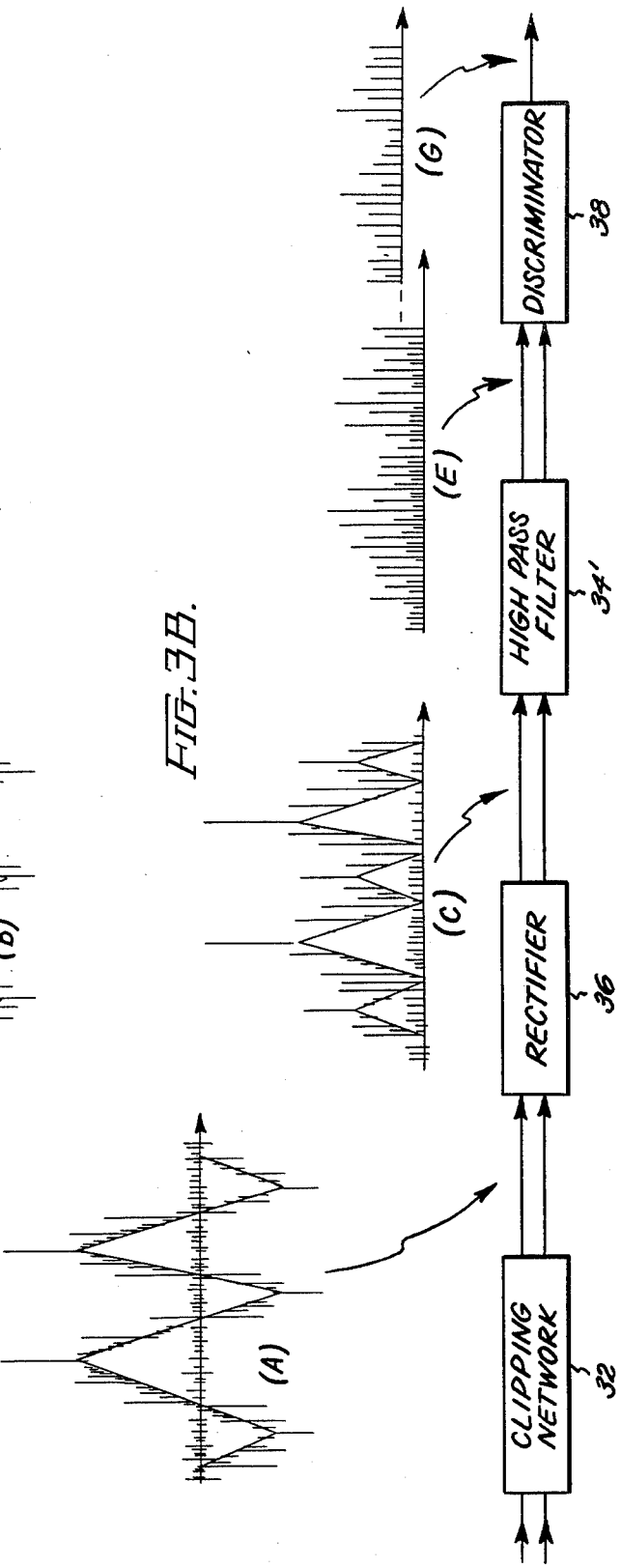

BRUSH ALIGNMENT APPARATUS

BACKGROUND OF THE INVENTION

This invention relates generally to an apparatus for processing electrical signals and in particular to an apparatus for aligning brushes of a dynamoelectric machine to minimize brush arcing.

In dynamoelectric machines such as dc generators brushes are used to conduct current to and from collector slip rings or commutators attached to a rotor. Typically, the brushes are mounted in a stationary brushholder assembly or rigging such as is shown, for a large generator, in U.S. Pat. No. 3,864,803 to Ohmstedt et al. which is also assigned to the same assignee as the present invention. This assembly supports the brushes and allows them to ride stably on the slip ring surface of the rotor. Although the brushholder rigging is held in fixed position during operation of the dynamoelectric machine, a small amount of rotational adjustment is often provided to permit varying of the commutation angle of the brushes for optimum performance of the dynamoelectric machine. In particular, the rigging should be set at a position such that arcing of the brushes during operation of the machine is avoided since, as is well known, arcing between the brushes and rotor slip ring results in electrical losses and can lead to damaged rotor slip rings, brushes, and brushholder riggings, forcing outages and repairs. For most machines, the total arc length through which the brushholder rigging may be rotated without resulting in brush arcing is quite small, for example, less than an inch even for large generators of power ratings of up to 3,000 kilowatts. The optimum rigging position within this narrow, arc-free region, which is known as the "black band" because of the absence of visible brush arcing when the machine is operated in this region, is normally determined for a generator prior to shipment by means of tests known as "buck" and "boost" tests. During these tests, which may be conducted at part generator load or at full load, current is applied to the generator field either in excess of that normally furnished by the excitation system (boost current) or less than that normally furnished (buck current), and output signals from the brushes are measured by a meter. In general, the apparatus output signals rise with increasing magnitude of buck or boost current applied, defining, when output signal is plotted against applied current, a curve which is approximately parabolic in shape whose minimum value of output signal may occur at a value of applied current on either side of the electrical neutral, the point at which only normal excitation current (no buck or boost current) is being applied to the generator field. The two end points of the parabolic-shaped curve are defined by levels of buck and boost current. An output signal at which the brushes begin arcing is determined optically or by means of a brush arc monitor such as described in U.S. Pat. No. 4,163,227 to Sawada et al. and which is also assigned to the same assignee as the present invention. For each brushholder rigging setting, a different parabolic-shaped curve may be generated, and the optimum rigging setting is determined as that for which minimum output signal occurs at or displaced a prescribed increment of current from, electrical neutral, and also as that which has substantially the maximum arc-free range of buck and boost currents. These criteria assure minimum brush arcing during normal operation of the dynamoelectric machine and thus long brush and slip ring lives.

Prior to the present invention, the above-described output signals from the brushes of the dynamo-electric machine being aligned were fed to an apparatus described in U.S. Pat. No. 4,204,156 issued May 20, 1980 to Sawada et al. and assigned to the same assignee as the present invention. Although very useful in the alignment of generator brushes, the apparatus described in this patent possesses several undesirable limitations. First, because of the nature of the signal processing which occurs, the output null voltage is higher than is necessary. Because this is so, the dynamic swing of the output voltage is significantly reduced. Second, the sharpness of the above-described parabolic-shaped curve is less than desirable, indicating an undesirable level of sensitivity for the output voltage as a function of the level of boost or buck current. In particular, this design permits passage of a level of low-frequency voltage which adversely affects the null point level and the alignment monitor sensitivity.

Accordingly, it is an object of the present invention to decrease the operator time involved in the alignment of generators and motors.

It is a further object of the present invention to provide brush rigging alignment with a decreased need for plotting a large number of sample points. It is also an object of the present invention to provide an alignment monitor having greater accuracy and stability with a greater reduction of noise.

SUMMARY OF THE INVENTION

By modifying the invention disclosed in the above-mentioned U.S. Pat. No. 4,204,156, a significant reduction in noise level and increased sensitivity is made possible. In particular, in accordance with a preferred embodiment of the present invention, the composite signals from the positive and negative brushes of the dynamoelectric machine are fed into a first filter network for attenuating low-frequency components and then, respectively, into a clipping network, into rectification means, into a second high-pass filter and then into a discriminator following which the signals are amplified by a radio frequency (rf) amplifier whose outputs are coupled to a peak integrator, the output of which is the desired signal which is a function of the boost or buck current. The differences between the present invention and that described in the U.S. Pat. No. 4,204,156 permit lowering of the null point to obtain greater sensitivity and sharpness for the alignment curve for precise adjustment of the brushholder rigging. Furthermore, improvements in the response of the (rf) amplifier permit the characteristic alignment curve of the machine to show a much sharper slope or trend in both the buck and boost modes so as to be able to provide alignment utilizing fewer plotting points.

BRIEF DESCRIPTION OF THE DRAWINGS

While the specification concludes with claims particularly pointing out and distinctly claiming the subject matter of the invention, the invention will be better understood from the following description taken in connection with the accompanying drawings in which:

FIG. 1 is a block diagram of a preferred embodiment of the invention.

FIG. 2 is a sketch of a composite signal such as may be processed by the brush alignment apparatus.

FIGS. 3A and 3B are block diagrams indicating differences in waveform patterns between the present invention and the apparatus described in U.S. Pat. No. 4,204,156.

DETAILED DESCRIPTION OF THE INVENTION

Figure 4:
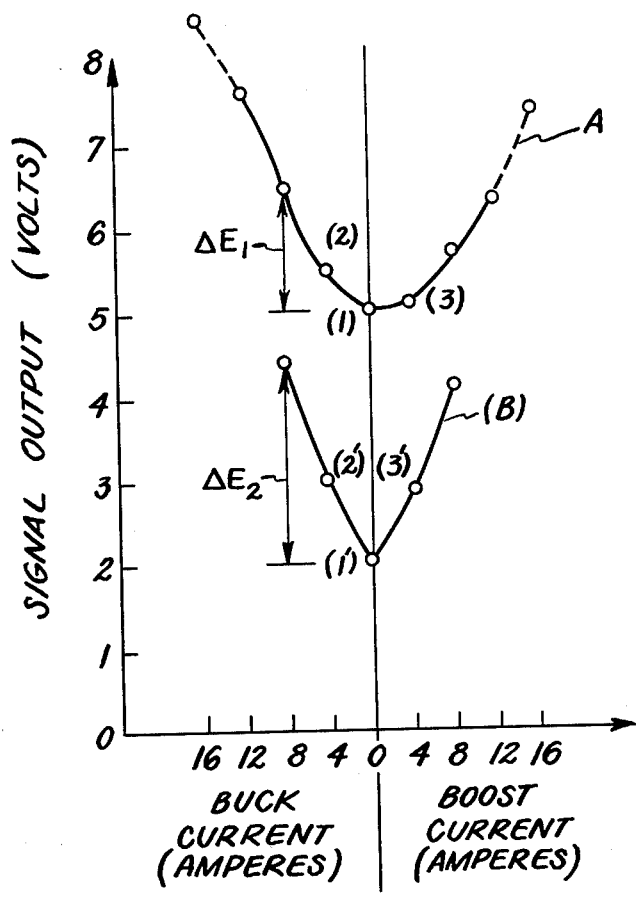
FIG. 4 is a graph showing plots of values of brush output signal versus applied current as measured by the apparatus of U.S. Pat. No. 4,204,156 and also as measured by the present invention during brush alignment tests.

Before the structure and operation of the brush alignment apparatus are set forth in detail a review of the particular intended uses of the invention is appropriate. Furthermore, it is hereby indicated that the aforementioned U.S. Pat. No. 4,204,156 is incorporated herein by reference. The brush alignment apparatus or monitor described herein is especially suited for aligning brushes of a dynamoelectric machine such as, but not limited to, a dc generator, so that during normal operation arcing of the brushes is avoided or minimized. This device is connected to the generator brushes during buck and boost tests wherein, by means of an auxiliary power supply current is added to (boost) or subtracted from (buck) a selected level of current applied to the generator by its associated excitation system. At an initial brushholder rigging setting and preferably at a no-load or low-load generator operating point, several different values of buck and boost current are applied and for each value of applied current, an output meter on the brush alignment apparatus records an output signal, which may be a voltage or a current. The brush alignment apparatus may also determine the arc-free range of buck and boost currents by indicating the on-set of brush arcing at the maximum buck and boost currents applied. The output signals from the brush alignment apparatus, when plotted against applied current, yield a curve approximately parabolic in shape as seen, for example, in the upper curve in FIG. 4, which shows curves for a prior art device and, in the lower curve, for the improved alignment apparatus of the present invention. The location of the minimum output signal with respect to electrical neutral (no buck or boost current applied) in these curves is indicative of the direction and amount of brushholder rigging adjustment required to attain the optimum position for avoidance of brush arcing. The brushholder rigging is adjusted the indicated amount, a second buck and boost sequence is run, an output signal is plotted, and the process repeated until the minimum output signal is obtained at a desired value of applied current with respect to electrical neutral. This is typically near the electrical neutral point but may be offset a small amount on the boost side since, as the generator load is increased, the minimum output signal location tends to shift slightly towards the buck side of neutral. After further checks at increased levels of loading and rigging position adjustments as necessary, alignment of the generator brushes for minimum arcing operation is complete.

FIG. 1 shows a block diagram of a preferred embodiment of the brush alignment monitor of the present invention which has input terminal 18 for receiving signals from positive brush 20 and input terminal 22 for receiving signals from negative brush 24. Brushes 20 and 24 each may comprise several brushes connected in parallel and held in a brushholder rigging (not shown) in a conventional manner to bear against rotatable collector slip rings 26 and 28 of a dynamoelectric machine such as a dc generator, the remainder of whose structure is omitted as not being material to the present invention. An example of a signal received by the monitor of FIG. 1 from brush 20 or 24 during an alignment test is shown in FIG. 2. This composite signal includes high-frequency information signals (i) associated with buck or boost currents (the generally upward pattern of high-frequency signals illustrated in FIG. 2 being more typical of boost currents) and which appear to ride on top of various noise signals. The noise signals comprise low-frequency components such as power frequency ripple indicated generally as (1) and whose wave length extends substantially over the entire time interval shown in FIG. 2. The noise signals also comprise sawtooth-shaped components (r) whose presence is due to slot and bar arrangements within the generator and which typically occur at fundamental bar and slot frequencies and their harmonics up to approximately 30 kilohertz. The noise signals may also include high-frequency noise spikes such as (s) caused, for example, by recurring switching of diodes in the excitation system of the generator.

To separate the information signals (i) to be measured from the other components present in the composite signals from brushes 20 and 24, the alignment monitor includes several processing networks as shown in the block diagram of FIG. 1. Terminals 18 and 22 which receive the composite signals are connected to a first filter network 30 which is provided so as to remove the low-frequency components (1) from the composite input thereto. Filter network 30 is in turn connected to clipping network 32 which functions to limit the positive and negative excursions of the signals to protect system circuitry and to prevent possible high-amplitude transients, such as spike (s), or noise spikes from introducing significant errors in the output signals calculated by the apparatus. From clipping network 32 the signals are fed into rectifier 36 which is preferably a full-wave rectifier. The rectifier reverses the sign of any negative signal components and then feeds the rectified signal to high-pass filter 34 which operates to remove all remaining signal components having frequencies less than a preselected value, such as 60 kilohertz. The major components eliminated by the filter network 34 are the sawtooth-shaped components (r) shown in FIG. 2 which occur at fundamental frequencies known from the slot and bar geometric parameters of the generator. It is to be noted that the signal processing occurring in the present invention particularly involving rectifier 36 and high-pass filter 34 are significantly different from the signal processing carried out in U.S. Pat. No. 4,204,156. These differences are more particularly elucidated in FIGS. 3A and 3B. The rf generator 33 serves a test function to be more particularly described below. Thus, the filtered, clipped, rectified and further filtered signal is then fed to discriminator network 38. Discriminator network 38 is adapted to combine the rectified signals and at each instant of time to permit passage therethrough of the rectified signal of greatest magnitude. The rectified signal from discriminator network 38 is successively amplified in rf amplifier 40 and integrated in peak integrator 42 to produce an output signal. Output meter 44 is provided to receive and display the output signal, and alarm system 46 may be included to give a visual and/or audible alarm when the output signal exceeds a level indicative of brush arcing.

FIGS. 3A and 3B illustrate the differences which lie at the heart of the distinction between the present invention and the apparatus disclosed in U.S. Pat. No. 4,204,156. In particular, the outputs of both clipping networks 32 are the same. Accordingly, this is indicated by waveform A. However, in the prior art apparatus shown in FIG. 3A, waveform A is first processed by a filter network 34 resulting in waveform B, as shown. Waveform B illustrates the fact that there is passage through the filter of some of the slot frequency ripple. For clarity, to show the presence of the slot frequency ripple some of the rf parasitic noise has been deleted. As seen, the output of the slot frequency ripples is slightly distorted. In particular, the base width of the ripples has been attenuated by filter network 34. In FIG. 3A, it is seen that waveform B is rectified by full-wave rectifier 36 and passed through discriminator 38. The discriminator threshold bias attenuates some of the ripple voltage but some higher amplitude ripples appear at the output of the discriminator as seen by waveform F. Although some of the noise pulses have been deleted from the drawing for clarity, some of the noise pulses will be passed through. Both this noise pulse and the slot frequency ripple significantly add to the null voltage and limit the swing of voltage produced at the output by the information pulses. This limits the overall gain of the radio frequency system and the response of the alignment apparatus. In contrast, the improved system of FIG. 3B first operates on waveform A from clipping network 32 by passage through full-wave rectifier 36, resulting in waveform C. Then, waveform C is processed by high-pass filter 34' to produce waveform E. It is of significance to note that high-pass filter 34' has a typical cutoff frequency of approximately 60 kilohertz. This is in significant contrast to filter network 34 in FIG. 3A which exhibits a typical cutoff frequency of approximately 30 kilohertz. Accordingly, much of the noise signal as seen in waveform E is reduced and the high-pass filter 34' has completely attenuated the slot frequency ripple. Accordingly, the output waveform of discriminator G indicates relatively clean radio frequency information. While there is still passage of some inherent radio frequency noise which passes through filter 34' and discriminator 38, the attenuation of the low-frequency noise pulses significantly improves the sensitivity in response of the brush alignment apparatus. This more precise alignment of the brushholder rigging results in a maximum span of black band and longer life for the carbon brushes as well as reducing the possibility of costly field outages.

This improvement in system sensitivity and performance is best illustrated in FIG. 4 which illustrates two plots of signal output voltage versus various levels of buck and boost current. In particular, in FIG. 4 there is shown curve A corresponding to a plot of the signal output voltage for the brush alignment monitoring apparatus of U.S. Pat. No. 4,204,156. In contrast curve B in FIG. 4 illustrates a plot of the signal output voltage of the present invention against the same set of variables, namely, the level of buck and boost current. It is of particular importance that the null point of curve A is at approximately five volts which is significantly higher than the null point of curve B which is at approximately two volts. This reduction in null point voltage for the apparatus of the present invention permits a much wider dynamic range for the output of the present invention. Additionally, it is to be noted that the parabolic shape of curve A is significantly flatter than the parabolic shape of curve B. This is indicative of the increased sensitivity of the apparatus of the present invention. In particular, at a buck current of approximately eight amperes it is seen that the difference between the null voltage and the output voltage for curve A, that is, $\Delta E_1$ is approximately 1.5 volts. In contrast, the corresponding voltage difference, $\Delta E_2$, for curve B, is approximately 2.4 volts. This indicates a significantly greater sensitivity for the apparatus of the present invention. It is this greater sensitivity that permits more precise alignment of dynamoelectric machine brushes.

Further advantages of the present invention are also illustrated in FIG. 4 by observing three points along curve A (points 1, 2 and 3) and three points along curve B (points 1', 2' and 3'). It is seen that points 1', 2' and 3' when plotted on a graph alone are much better indicators of the actual shape of the alignment curve. In contrast, points 1, 2 and 3 are not so indicative. Thus, because of the increased sensitivity of the apparatus of the present invention it is possible for an operator to perform brush alignment or brush realignment having observed and plotted only three data points. Thus, the apparatus of the present invention permits a more rapid alignment of the brush rigging and accordingly increases worker productivity.

Figure 5A:
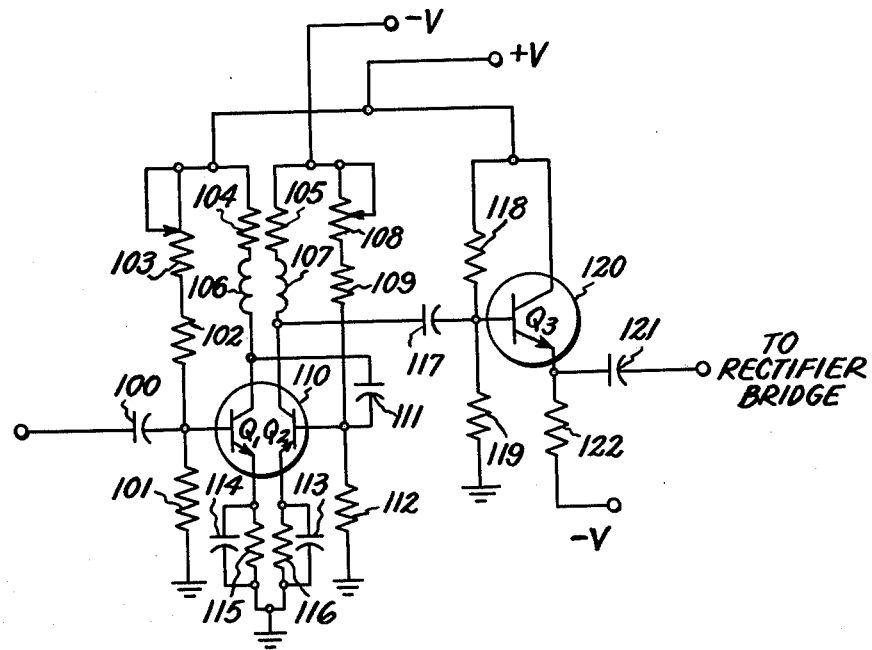
FIG. 5A is a schematic diagram illustrating a linear one-way load-line configuration for an rf amplifier.
Figure 8:
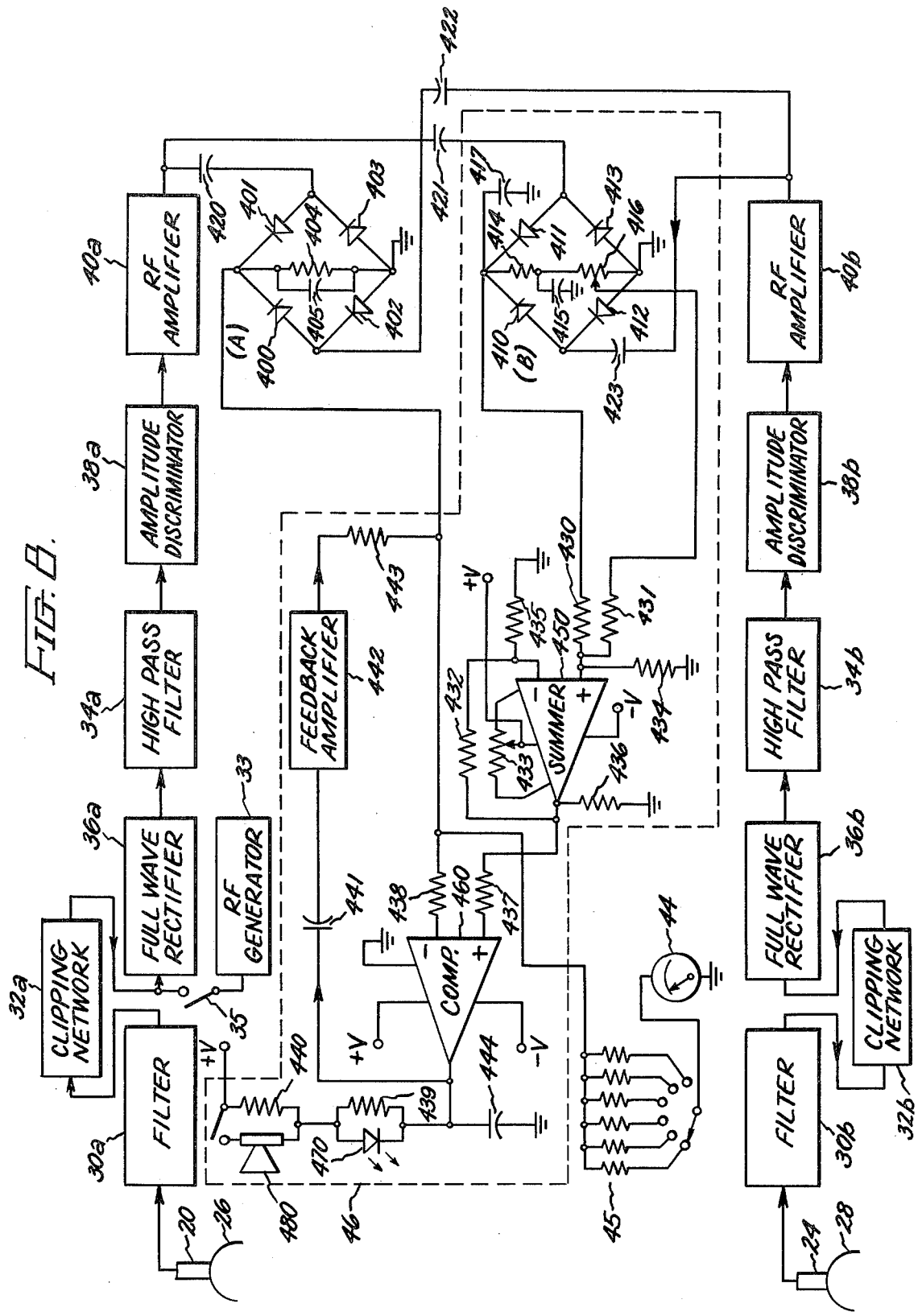
FIG. 8 is partially a schematic and partially a block diagram further illustrating the peak integrator and alarm system.

A further improvement in the present invention over that of U.S. Pat. No. 4,204,156 is that the present invention employs a linear one-way load-line rf amplifier. The employment of such a device permits a wider dynamic range in the output voltage. Such an amplifier is shown in FIG. 5A. The input to this amplifier is received from the discriminator 38 through capacitor 100 which is coupled to the base of NPN transistor Q1 which is preferably contained in a single package 110 with complementary PNP transistor Q2. The base of transistor Q1 is referenced to ground through resistor 101 and is coupled to the +V supply voltage through resistor 102 and variable resistor 103 connected in series therewith. The emitter of Q1 is referenced to ground through the parallel combination of resistor 115 and capacitor 114. The collector of Q1 is connected to the positive supply voltage +V through choke 106 and resistor 104. Additionally, the collector of transistor Q1 is coupled into the base of transistor Q2 through capacitor 111 whose emitter is likewise referenced to ground through a parallel resistor-capacitor combination, 116 and 113 as shown respectively. The base of transistor Q2 is referenced to ground through resistor 112 and is also connected to the negative supply voltage $-V$ through bias resistors 109 and 108, 108 being a variable resistor. Additionally, the collector of transistor Q2 is connected to the negative supply voltage $-V$ through the series connection of choke 107 and resistor 105. These transistors, Q1 and Q2 operate in a linear one-way mode to assure a large swing in the active zone of the curves shown in FIGS. 5B and 5C. In the circuit shown in FIG. 5A the first stage Q1 is an NPN transistor operating at a quiescent point near cutoff. Since the input pulse as applied to Q1 is positive going, this transistor turns on and the operating point swings upward along the load-line, depending upon the magnitude of the rf information pulse. Transistor Q2 is also operating at a quiescent operating point near cutoff. Since output of transistor Q1 is negative going, the conduction of Q2, a PNP transistor, occurs driving the Q2 operating point upward on the load-line. By operating transistors Q1 and Q2 near the cutoff zone, a large swing is possible without saturating the rf amplifier. The remainder of the amplifier shown in FIG. 5A is a conventional emitter follower, transistor Q3 being connected at its base to the collector of transistor Q2 through coupling capacitor 117. Resistor 119 references the base of Q3 to ground, and resistor 118 is a biasing resistor connecting the base of transistor Q3 to the positive supply voltage +V. Transistor Q3 is contained in package 120 and has its collector connected to the positive voltage supply +V. The emitter of transistor Q3 is connected to the negative voltage supply −V through resistor 122. The output of the amplifier is connected to the rectifier bridge or bridges as shown in FIG. 8. This connection is made through capacitor 121.

Figure 5B:
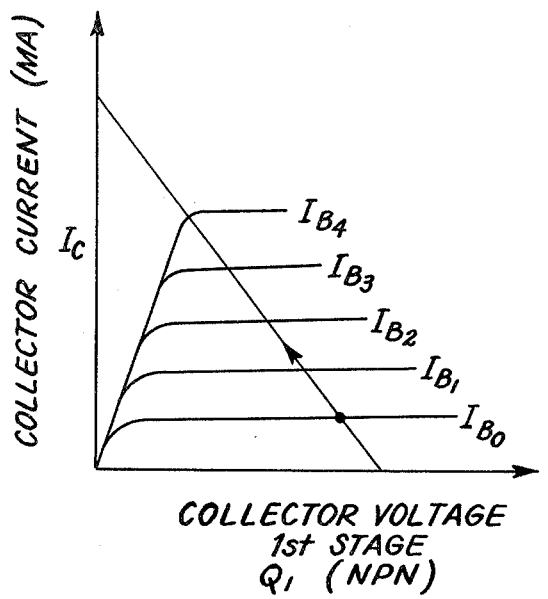
FIGS. 5B and 5C are plots of collector current versus collector voltage for the two transistors operating in the linear one-way load-line mode.
Figure 5C:
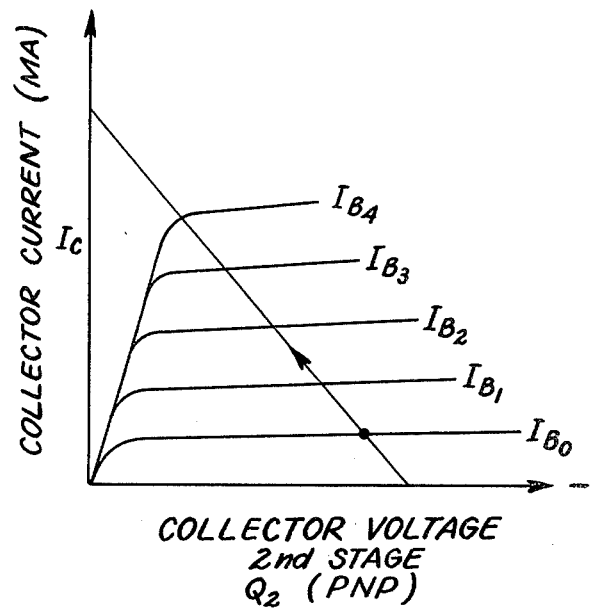

FIGS. 5B and 5C are conventional transistor operating curves in which there are shown plots of the collector current versus the collector voltage. FIG. 5B is a plot for transistor Q1 and FIG. 5C is a plot for transistor Q2. Transistors Q1 and Q2, as indicated above, are biased so as to operate near the cutoff region, that is along the load-line corresponding to the base current shown $I_{B0}$. FIG. 5C illustrates an identical set of curves for transistor Q2. However, it is to be noted that the horizontal axis extends to the right in the direction of increasingly negative collector voltage.

Figure 6:
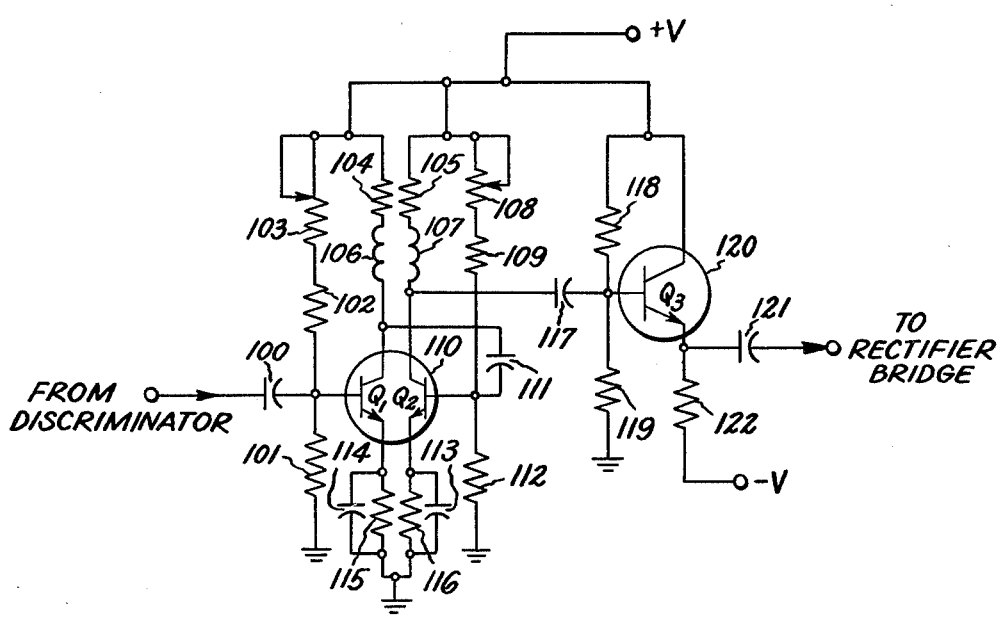
FIG. 6 is an alternate embodiment of the rf amplifier illustrating a staggered load-line amplifier.

A staggered load-line rf amplifier is shown in FIG. 6. This amplifier is very similar to the amplifier shown in FIG. 5A except that package 110 comprising NPN transistor Q1 and PNP transistor Q2 has been replaced by transistor package 110' comprising NPN transistor Q1' and NPN transistor Q2'. Accordingly, the supply voltages are adjusted as shown in FIG. 6 to provide the proper bias for the first two stages of the amplifier. In this amplifier, transistor Q1' is biased to operate near cutoff and Q2' near saturation. Accordingly, input signals tend to drive Q1' toward saturation and Q2' toward cutoff.

Figure 7:
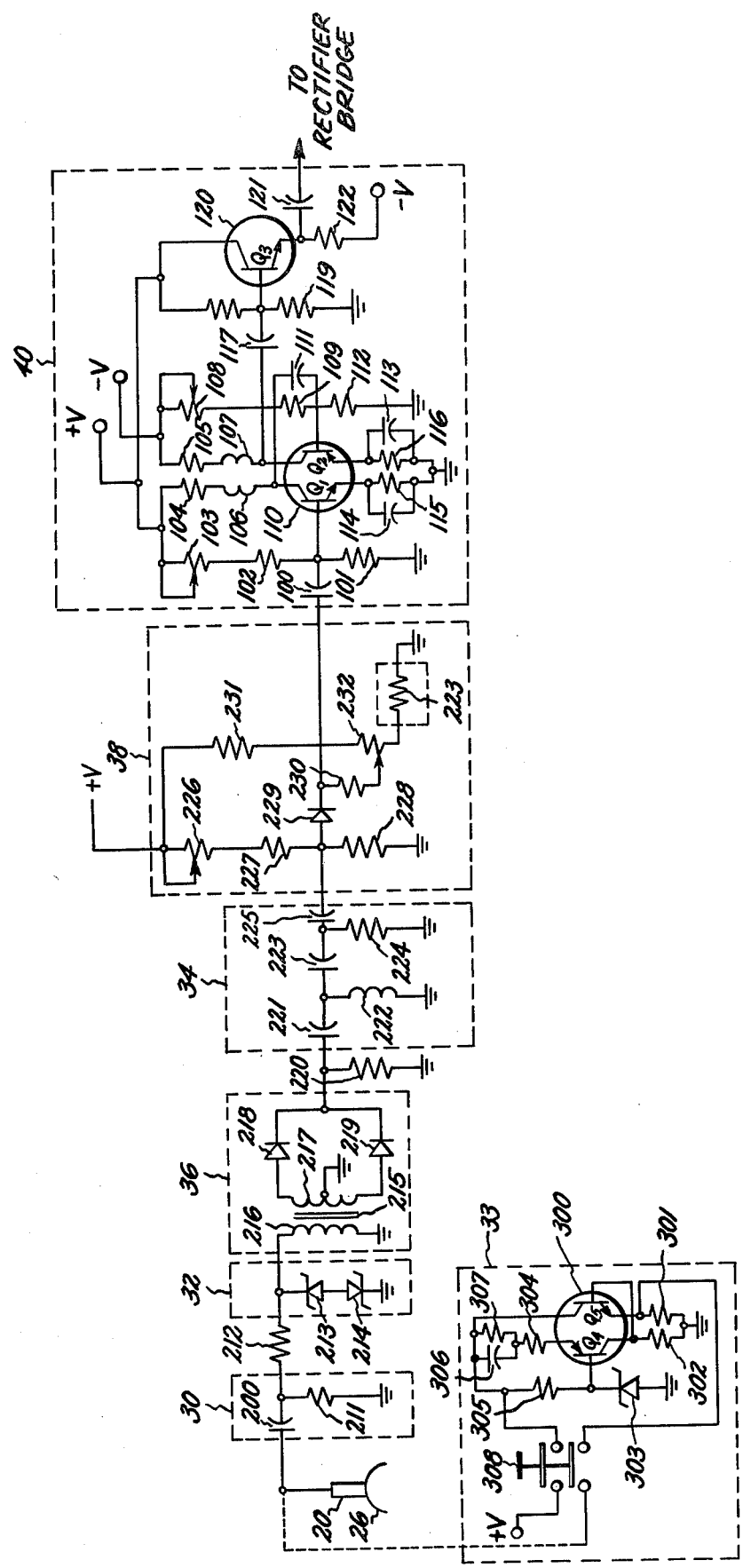
FIG. 7 is a schematic diagram illustrating one embodiment of a portion of the present invention.

FIG. 7 shows a detailed schematic diagram illustrating one embodiment of the present invention. In particular FIG. 7 shows one-half of the signal processing circuitry encompassing blocks 30, 32, 36, 34, 38 and 40 and also block 33, as shown in FIG. 1. Details of the peak integrator 42, output meter 44, and alarm 46 are shown below in FIG. 8. The input composite waveform for the apparatus shown in FIG. 7 is received from brush 20 which rotates against collecting ring 26. The initial high-pass filter 30 comprises series capacitor 200 followed by resistor 211 which is connected to the ground of the system. The signal is then fed through resistor 212 to the clipping network 32 which may comprise, for example, a pair of back-to-back zener diodes 213 and 214. From the clipping network, the signal is fed to rectifying network 36 here shown as preferably comprising a full-wave rectifier which includes transformer 215 having primary 216 and center tap secondary 217. The center tap of the secondary 217 is referenced directly to ground, the other ends of the secondary winding being connected to diodes 218 and 219, respectively, as shown. The rectified voltage appears thus across resistor 220 which is directly referenced to ground. From this point the processed waveform is fed into high-pass filter network 34 which is shown here as comprising a T filter with series capacitors 221 and 223, the node between which is referenced to ground through inductor 222. The T network is followed by a series capacitor 225, and resistor 224 references the node between capacitors 223 and 225 directly to ground. From capacitor 225 the signal is fed into back-biased diode discriminator 38. The cathode of diode 229 is referenced to ground by resistor 228; it is also connected to the positive voltage supply +V through series-connected resistors 227 and 226, the latter being variable. The anode of diode 229 is connected to the central wiper arm of potentiometer 232 through resistor 230. One side of the potentiometer 232 is connected to the positive voltage supply +V through resistor 231 and the other side of potentiometer 232 is connected to ground through sensistor 233. This is preferably a silicon resistor with a temperature coefficient of resistance of approximately 0.7 ohms per degree centigrade over an ambient temperature range of approximately −60° C. to +150° C. Silicon resistor 233 thus operates to apply a temperature varying reverse bias to diode 229 to compensate for the change in inherent threshold potential of these diodes of approximately two millivolts per degree centigrade and thus to maintain constant threshold sensitivity and accuracy of signals passed through discriminator 38. Finally, the output of discriminator 38 is derived from the anode of diode 229 and this output is coupled to the rf amplifier 40 through capacitor 100. Further discussion of the operation of amplifier 40 at this point is unnecessary since it is described in full above with reference to FIGS. 5A and 6. The output of rf amplifier 40 is then fed to a rectifier bridge which, in this case, is configured to operate as a peak integrator.

In order to assure greater system reliability an rf generator 33 is provided in the present invention. This feature is not found in any of the prior art brush alignment monitor devices. In particular, the rf generator 33 functions to produce radio frequency information which is applied directly to the input of the alignment monitor at brush 20, as shown by the dotted connection line. This rf generator serves a test function. First it tests the operation of the overall system by providing a signal which is capable of generating a known, fixed response. Accordingly, rf generator 33 can be used to calibrate the performance of the system and to detect any degradation over long periods of time. Secondly, the cable connecting the brushes to the input of the monitor apparatus may from time to time be subject to mechanical interruption. Accordingly, the rf generator 33 also provides a means for testing the cable connection.

The rf generator 33 may comprise any conventionally known oscillating circuit. One embodiment of the present invention incorporates the rf generator 33 shown in FIG. 7. In this configuration transistor Q4 possesses a base which is referenced to ground through zener diode 303 and whose base is connected to the positive voltage supply through resistor 305 and through double pole, single throw switch 308, as shown. The emitter of transistor Q4 is likewise connected to the positive voltage supply through resistor 304 in series with the parallel combination of resistor 307 and capacitor 306. The collector of transistor Q4 is referenced to ground through resistor 302 and is also connected to the base of transistor Q5. Transistors Q4 and Q5 are typically contained within a single package 300. The collector of transistor Q5 is connected directly to the positive voltage supply +V through switch 308 and the emitter of transistor Q5 is referenced to ground through resistor 301 and the emitter of Q5 is further connected to the output of the rf generator through switch 308 which functions to simultaneously connect the rf generator to a power source and to apply the output of the generator to the input of the brush alignment monitor. Furthermore, as shown in FIG. 1, rf generator 33 may be coupled into the alignment apparatus of the present invention at the input of clipping network 32. However, the connection shown in FIG. 7 is preferred since this permits a more thorough test function.

FIG. 8 is a partial block and partial schematic diagram of an improved brush alignment monitor in accordance with the present invention. In particular, FIG. 8 illustrates the peak integrator employed and also illustrates the details of one embodiment of the alarm 46. The connection of output meter 44 is likewise shown in greater detail in this figure. While the alignment apparatus of the present invention is operable using only the output of a single brush, it is preferred that the output signals from both the positive and negative brushes are processed and passed through a peaking device which permits the passage therethrough of the maximum of the process signals from the positive and negative brushes. In the present invention this function is carried out by the bridge network designated (A) in FIG. 8. Thus, up to the rectifier bridge (A), the signal processing for the waveforms from each of the brushes is substantially the same, the signal from brush 20 being processed through filter 30a, clipping network 32a, full-wave rectifier 36a, high-pass filter 34a, discriminator 38a, and amplifier 40a. Likewise, the signal from brush 24 is processed through filter 30b, clipping network 32b, full-wave rectifier 36b, high-pass filter 34b, discriminator 38b and amplifier 40b. The output of amplifier 40a is fed through coupled capacitor 420 to one side of rectifier bridge (a). The output of amplifier 40b is fed through coupling capacitor 422 to the other side of rectifier bridge (A). This rectifier bridge comprises diodes 400, 401, 402 and 403 connected in the conventional configuration as shown in FIG. 8, the bottom portion of the bridge being referenced to ground directly. Thus, two opposite corners of the bridge receive the inputs from the amplifiers 40a and 40b and the output is taken across the other two bridge corners, one of which is grounded and the other of which is connected to resistor bank 45. Also, across the output side of the bridge and the ground there are connected, in parallel, resistor 404 and capacitor 405 which act as an integrating circuit. The rectifier bridge (A) operates to pass therethrough and across the integrating circuitry the signal from the amplifier having the largest value. Resistor bank 45 receives the output signal from rectifier bridge (A) and couples this signal through a single pole, multi-throw switch to meter 44 which indicates the output level. It is the value from this meter which is plotted in FIG. 4.

The remaining portion of FIG. 8 shown in box 46 describes an alarm system which operates to provide the operator with a visual and/or audible alarm upon the occurrence brush arcing. The operation of alarm 46 is similar to the operation as described in the above-mentioned U.S. Pat. No. 4,204,156. The heart of the alarm system of the present invention is found in rectifier bridge (B) comprising diodes 410, 411, 412 and 413 configured as shown in FIG. 8. Again, the sides of this rectifier bridge receive processed waveforms form the outputs of rf amplifiers 40a and 40b through coupling capacitors 421 and 423, respectively. The bottom node of rectifier bridge (B) is similarly referenced directly to ground and the output from this bridge is taken from the top node between diodes 410 and 411. Between this output node and the ground there is also connected a resistance-capacitance network comprising resistors 416 and 414 and capacitors 415 and 417. Resistor 416 is variable and has a wiper arm which is connected to resistor 431. It is this resistance-capacitance network which provides rectifier bridge (B) with a time constant approximately 200 times the time constant provided by the resistor-capacitor network 404, 405 and rectifier bridge (A). Thus, rectifier bridge (A) responds rapidly to bursts of radio frequency energy passing through the signal processing network as a result of brush arcing. The output of rectifier bridge (B) is connected to summer 450 through resistor 430 at its non-inverting input which is also connected to resistor 431 receiving threshold signals from the wiper arm of resistor 416. The variable threshold signal provided through resistor 431 may also be provided by any other convenient means such as by a potentiometer connected across a zener diode which is connected between the power supply and the ground. Summer 450 may also include resistors 432 through 436, connected as shown, and additionally summer 450 is connected to both the positive supply voltage +V and the negative supply voltage −V. It is appreciated by those skilled in the art that other summer configurations may be employed and that the associated resistive network may be incorporated into a single integrated package. The output of the summer is connected to the non-inverting input of comparator 460 through resistor 437. The inverting input of the comparator 460 is coupled through resistor 438 to the output of rectifier bridge (A). The output of the comparator is coupled through capacitor 441 to feedback amplifier 442 and resistor 443 back to its inverting input through resistor 438, as shown. The output of the comparator is connected to the series combination of a visual indicator, such as a light-emitting diode 470 or an audible alarm 480 which may be disabled by a switch as shown. Additionally, resistors 439 and 440 may be connected across light-emitting diode 470 or audible alarm 480 to provide needed current division. Because of the relative delay in the passage of brush arcing signals through the rectifier bridges, an audio and visual alarm is provided upon brush arcing conditions. This occurs because the time constant of rectifier bridge (A) is somewhat faster than the time constant of rectifier bridge (B).

From the above, it may be appreciated that the apparatus of the present invention provides a brush alignment monitor which offers several advantages over prior art devices. In particular, the time for alignment of a dc generator or motor is significantly shortened. Because of the increased sensitivity fewer plotting points are required to determine the alignment curve. The trend of buck or boost mode current is clearly defined with a minimum of data. This apparatus results in greater accuracy and stability in the alignment as a result of higher signal-to-noise ratios. Additionally, a wide range of operation is possible because of the one-way or staggered load-line operation of the rf amplifier system.

While the invention has been described in detail with reference to certain preferred embodiments operative to align brushes of a generator, it is understood that various modifications and alternative uses, such as an alignment of motor brushes, will be apparent to those skilled in the art. It is therefore intended by the appended claims to cover all such modifications and uses which are within the true spirit and scope of the present invention.

What is claimed is:

1. An apparatus for aligning brushes of a dynamoelectric machine to minimize arcing of the brushes, said apparatus comprising:

means for receiving from a brush of a dynamoelectric machine a composite signal including noise signals and high-frequency information signals, said composite signal produced during operating mode of the dynamoelectric machine wherein a buck or boost current is superimposed on a preselected level of excitation current applied to the machine;

a first filter network for removing low-frequency components of said noise signal from said composite signal;

a clipping network connected to said first filter network for removing from said composite signal all components having absolute value of amplitude in excess of a preselected value;

means for rectifying the signal from said clipping network to provide a rectified signal;

a second filter network for removing from said rectified signal substantially all of the components of said noise signals input to said rectifying means and having frequencies less than a cutoff value determined from the fundamental slot and bar frequencies of the dynamoelectric machine;

means for amplifying and integrating said signal from said second filter to produce an output signal, said output signal, together with the level of said boost or buck current, being indicative of brush alignment adjustment required to minimize brush arcing; and output means for displaying said output signal.

2. The apparatus of claim 1 wherein said signal receiving means, said filter network, said clipping network, and said rectification means comprise a first signal path for processing a composite signal from a positive brush and a second signal path in parallel with said first signal path for processing a composite signal from a negative brush, and apparatus further includes a discriminator network responsive to said signals from said second filter network and adapted to permit passage therethrough the discriminator network at any given time during operation of said apparatus the received signal of maximum magnitude.

3. The apparatus of claim 2 further including an alarm system responsive to said output signal and adapted to produce an alarm signal when said output signal exceeds a reference signal.

4. The apparatus of claim 1 in which said amplifying means comprises an rf amplifier operating in a staggered load-line mode.

* * * * *